United States Patent
Lee et al.

(10) Patent No.: US 7,124,381 B2
(45) Date of Patent: Oct. 17, 2006

(54) METHOD OF ESTIMATING CROSSTALK NOISE IN LUMPED RLC COUPLED INTERCONNECTS

(75) Inventors: Herng-Jer Lee, Tao-Yuan (TW); Chia-Chi Chu, Tao-Yuan (TW); Wu-Shiung Feng, Tao-Yuan (TW); Ming-Hong Lai, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 254 days.

(21) Appl. No.: 10/853,854

(22) Filed: May 25, 2004

(65) Prior Publication Data

US 2005/0278668 A1  Dec. 15, 2005

(51) Int. Cl.
*G06F 17/50* (2006.01)
(52) U.S. Cl. .................. 716/4; 716/1; 716/3; 716/5
(58) Field of Classification Search .............. 716/1, 716/3, 4, 5, 6, 2
See application file for complete search history.

(56) References Cited

U.S. PATENT DOCUMENTS

| | | | |
|---|---|---|---|
| 5,481,695 A | 1/1996 | Purks ...................... 395/500 |
| 5,535,133 A | 7/1996 | Petschauer et al. ......... 364/489 |
| 5,555,506 A | 9/1996 | Petschauer et al. ......... 364/491 |
| 5,568,395 A | 10/1996 | Huang ...................... 364/489 |
| 5,596,506 A | 1/1997 | Petschauer et al. ......... 364/491 |
| 6,018,623 A | 1/2000 | Chang et al. .......... 395/500.07 |
| 6,029,117 A | 2/2000 | Devgan ...................... 702/58 |
| 6,405,348 B1 | 6/2002 | Fallah-Tehrani et al. ....... 716/4 |
| 6,434,729 B1 * | 8/2002 | Alpert et al. ................. 716/6 |
| 6,732,065 B1 * | 5/2004 | Muddu ....................... 703/2 |
| 2003/0115563 A1 * | 6/2003 | Chen ........................ 716/5 |
| 2003/0237070 A1 * | 12/2003 | Tomita et al. ............... 716/12 |
| 2005/0060674 A1 * | 3/2005 | Roethig ..................... 716/5 |
| 2005/0060675 A1 * | 3/2005 | Tetelbaum .................. 716/5 |

OTHER PUBLICATIONS

Lee et al.,"Crosstalk Estimation in High-Speed VLSI Interconnect using Coupled RLC-tree Models", Oct. 2002, Asia-Pacific Conference on Circuits and Systems, paper, vol. 1, pp. 257-262.*
Lee et al.,"Moment Computations of Nonuniform Distributed Coupled RLC trees with Estimating Crosstalk Noise", 2004, 5th International Symposium on Quality Electronic Design, Proceedings, pp. 75-80.*
Davis et al.,"Compact Distributed RLC Models for Multilevel Interconnect Networks", Jun. 1999, Symposium on VLSI Circuits, Technical Paper Digest, pp. 167-168.*
Cao et al.,"A New Analytical Delay and Noise Model for On-Chip RLC Interconnect", Dec. 2000, International Electronic Devices Meeting, Technical Paper Digest pp. 823-826.*

* cited by examiner

*Primary Examiner*—Sun James Lin
(74) *Attorney, Agent, or Firm*—Alan D. Kamrath; Nikolai & Mersereau, P.A.

(57) ABSTRACT

A method for efficiently estimating crosstalk noise of high-speed VLSI interconnects models high-speed VLSI interconnects as lumped RLG coupled frees. An inductive crosstalk noise waveform can be accurately estimated in an efficient manner using a linear time moment computation technique in conjunction with a projection-based order reduction method. Recursive formulas of moment computations for coupled RC trees are derived taking into consideration of both self inductances and mutual inductances. Also, analytical formulas of voltage moments at each node will be derived explicitly. These formulas can be efficiently implemented for use in crosstalk estimations.

4 Claims, 6 Drawing Sheets

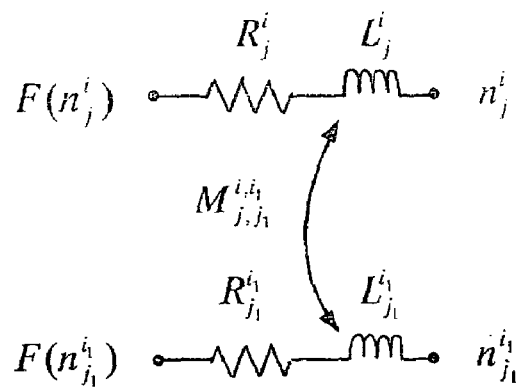
(a)
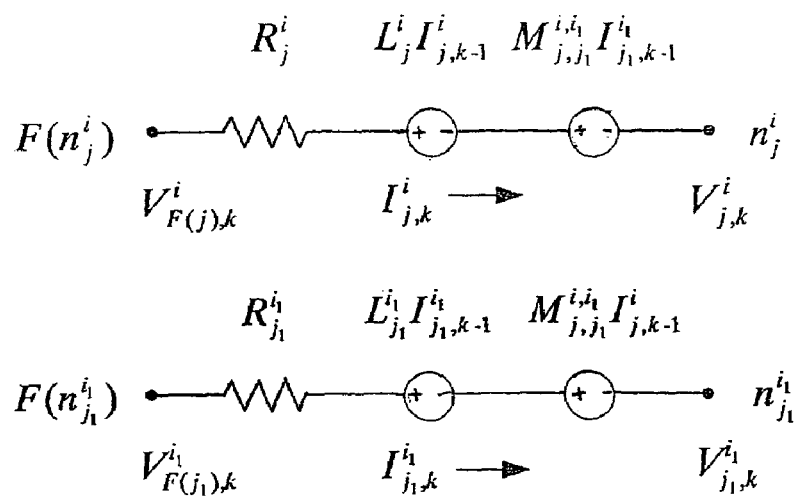
(b)
Fig. 4

$MomCom(Max\ Order)$ {
  $ZerothOrderMom()$;
  for $k = 1$ to $MaxOrder$ {
    for each tree $T^i$ {
      $Current(T^i, n_0^i, k)$;
      $Voltage(T^i, n_0^i, k)$; }}}

$ZerothOrderMom()$ {
  for the root of each tree $T^i$ with voltage $V_0^i$ {
    for each node $n_j^i \in N^i$
    $V_{j,0}^i = V_{0,0}^i$; }}

$Current(tree\ T^i, node\ n_j^i, order\ k)$ {
  $current = 0$;
  if $(n_j^i \neq n_0^i)${
    $current = C_{j,0}^i \cdot V_{j,k-1}^i$;
    if $(CC_j^i \neq \phi)${
      for each coupling capacitance $C_{j,j_l}^{i,i_l} \in CC_j^i$
      $cruuent + = C_{j,j_l}^{i,i_l} \cdot (V_{j,k-1}^i - V_{j_l,k-1}^{i_l})$}
    $I_{C_{j,k}}^i = current$; }
  for each $n_x^i \in S(n_j^i)$
    $current + = Current(T^i, n_x^i, k)$;
  $I_{j,k}^i = current$;
  return $current$; }

$Voltage_{LM}\ (tree\ T^i, node\ n_j^i, order\ k)$ {
  if $(n_j^i == n_0^i)$
    $V_{j,k}^i = V_{LM_{j,k}}^i = 0$;
  else {
    $V_{j,k}^i = V_{F(j),k}^i - R_j^i I_{j,k}^i$;
    $V_{LM_{j,k}}^i = L_j^i I_{j,k-1}^i$;
    if $(MM_j^i \neq \phi)${
      for each mutual inductance $M_{j,j_l}^{i,i_l} \in MM_j^i$
      $V_{LM_{j,k}}^i + = M_{j,j_l}^{i,i_l} I_{j_l,k-1}^{i_l}$; }
    $V_{j,k}^i - = V_{LM_{j,k}}^i$; }
  for each $n_x^i \in S(n_j^i)$
    $Voltage_{LM}(T^i, n_x^i, k)$; }

Fig. 5

(a)
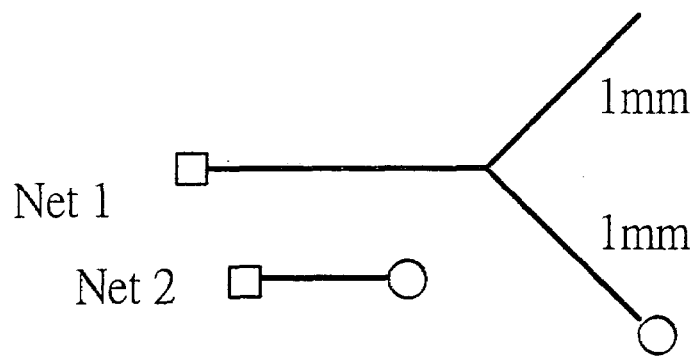
(b)
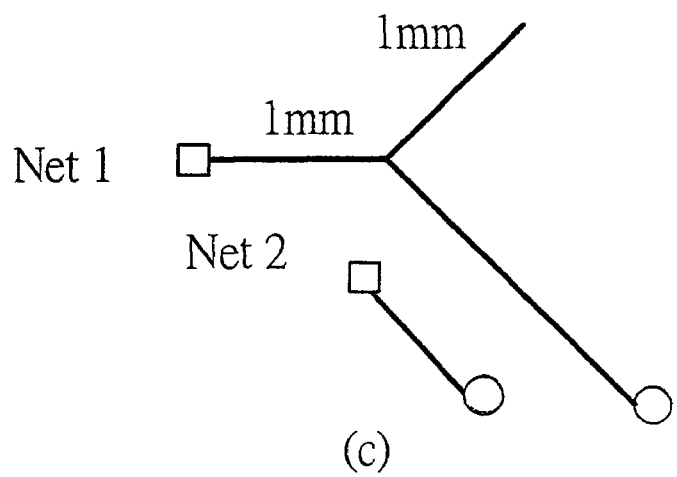
(c)
Fig. 6

METHOD OF ESTIMATING CROSSTALK NOISE IN LUMPED RLC COUPLED INTERCONNECTS

BACKGROUND OF THE INVENTION

1. Field of the Invention

The present invention relates to a method of estimating crosstalk noise in high-speed VLSI interconnects and, more particularly, to a method of using moment computations of lumped coupled RLC-tree models and project-based model-order reduction techniques.

2. Description of Related Art

Modern technological trends have caused interconnect modeling to have attracted considerable attention in high-speed VLSI designs. Owing to these designs with performance considerations, increasing clock frequency, shorter rising times, higher density of wires, and using low-resistivity materials, on-chip inductance effects can no longer be ignored in interconnect models. Furthermore, the importance of coupling inductance effects has grown continuously since nanometer technology has emerged over the last few years. It has been observed that crosstalk noise estimations made by considering inductance effects may yield more pessimistic results than those made without considering coupling inductance effects, as discussed in C. K. Cheng, J. Lillis, S. Lin, and N. H. Chang, *Interconnect Analysis and Synthesis*, John Wiley and Sons Inc., 2000. Such estimation errors follow from two main reasons: (1) more and longer wires in parallel increase the capacitive coupling, leading to large current changes on the victim nets, and (2) increasing self inductance worsens overshooting spikes on aggressor nets, and may worsen noise on the victim nets. For the above practical considerations, interconnect models shall be extended to be coupled RLC trees while considering the inductance effects.

A common manner of estimating crosstalk noise is implemented by simulating circuit-level VLSI interconnects. Although the results are very accurate, the computational complexity is excessive, especially for large-scale interconnect simulations. An alternative approach, called model-order reduction methods, has recently emerged to solve the problem, as disclosed in L. T. Pillage and R. A. Robrer, "Asymptotic waveform evaluation for timing analysis," *IEEE Trans. Computer-Aided Design*, vol. 9, no. 4, pp. 352–366, 1990; P. Feldmann and R. W. Freund, "Efficient linear circuit analysis by Pade approximation via the Lanczos process," *IEEE Trans. Computer-Aided Design*, vol. 14, no. 5, 1995, and A. Odabasioglu, M. Celik, and L. T. Pileggi, "PRIMA: passive reduced-order interconnect macromodeing algorithm," *IEEE Trans. Computer-Aided Design*, vol. 17, no. 8, pp. 645–653, 1998. Rather than directly estimating the crosstalk waveform of the original interconnects, the crosstalk noise of the reduced-order system is estimated. However, the computational cost is still too high for a noise optimization problem even though model-order reduction methods have reduced the cost, as disclosed in A. Devgan, "Efficient coupled noise estimation for on-chip interconnects," in *Porc. ICCAD*, 1997, pp. 147–151; and M. Kuhlmann and S. S. Sapatnekar, "Exact and efficient crosstalk estimation," *IEEE Trans. Computer-Aided Design*, vol. 20, no. 7, pp. 858–866, 2001.

A consensus has emerged that of the many model-order reduction techniques, the moment matching approach seems to be the most viable for estimating interconnect crosstalk noise. For computational efficiency, traditional models for estimating noise in coupled RC trees have been developed, including the one-pole model (1P) (as disclosed in A. Vittal, L. H. Chen, M. Marek-Sadowska., K. P. Wang, and S. Yang, "Crosstalk in VLSI interconnects," *IEEE Trans. Computer-Aided Design*, vol. 18, pp. 1817–1824, 1999; and A. Vittal and M. Marek-Sadowska, "Crosstalk reduction for VLSI," *IEEE Trans. Computer-Aided Design*, vol. 16, pp. 290–298, 1997), the modified one-pole model (M1P) (as disclosed in Q. Yu and E. S. Kub, "Moment computation of lumped and distributed coupled RC trees with application to delay and crosstalk estimation," *Proceedings of the IEEE*, vol. 89, no. 5, pp. 772–788, 2001), the two-pole model (2P) (as discussed in M. Kuhlmann and S. S. Sapatnekar, "Exact and efficient crosstalk estimation," *IEEE Trans. Computer-Aided Design*, vol. 20, no. 7, pp. 858–866, 2001; and Q. Yu and E. S. Kuh, "Moment computation of lumped and distributed coupled RC trees with application to delay and crosstalk estimation," *Proceedings of the IEEE*, vol. 89, no. 5, pp. 772–788, 2001), the stable two-pole model (S2P) (as disclosed in E. Acar, A. Odabasioglu, M. Celik, and L. T. Pileggi, "S2P: A stable 2-pole RC delay and coupling noise metric," in *Proc. 9th Great Lakes Symp. VLSI*, March 1999, pp. 60–63), and the guaranteed stable three-pole model (S3P) (as discussed in Q. Yu and E. S. Kuh, "Moment computation of lumped and distributed coupled RC trees with application to delay and crosstalk estimation," *Proceedings of the IEEE*, vol. 89, no. 5, pp. 772–788, 2001). Unlike the general model-order reduction methods, the techniques simply estimate the peak value of crosstalk noise and the time at which it peaks rather than evaluating the waveform of crosstalk noise. Also, U.S. Pat. Nos. 5,481,695; 5,535,133; 5,555,506; 5,568,395; 5,596,506; 6,018,623; 6,029,117; and 6,405,348 have disclosed the techniques about the crosstalk noise estimations. However, since the interconnect crosstalk noise may have a non-monotonic response waveform, these models seem to be unsuitable for capturing the essential nature of such crosstalk noise.

Recently, the delay and noise formulae by considering self inductances and mutual inductances have been disclosed in Y. Cao, X. Huang, D. Sylvester, N. Chang, and C. Hu, "A new analytical delay and noise model for on-chip RLC interconnect," in *Proc. IEDM* 2000, 2000, pp. 823–826. However, their model is restricted to two parallel lines. The analytical delay and overshooting formulae for coupled RLC lines have been disclosed in M. H. Chowdhury, Y. I. Ismail, C. V. Kashyap, and B. L. Krauter, "Performance analysis of deep sub micron VLSI circuits in the presence of self and mutual inductance," in *Proc. ISCAS* 2002, 2002, pp. 197–200. However, issues concerning inductive crosstalk noise analysis have still not yet been studied. Furthermore, by exploring the special nature of RLC-tree structures, recursive algorithms for computing system moments with linear order have been developed, for example, by C. L. Ratzlaff and L. T. Pillage, "RICE: rapid interconnect circuit evaluation using AWE," *IEEE Trans. Computer-Aided Design*, vol. 13, no. 6, pp. 763–776, 1994 and Q. Yu and E. S. Kuh, "Exact moment matching model of transmission lines and application to interconnect delay estimation," *IEEE Trans. VLSI syst.*, vol. 3, no. 2, pp. 311–322, 1995, independently. Moment models of general transmission lines were presented in Q. Yu, E. S. Kuh, and T. Xue, "Moment models of general transmission lines with application to interconnect analysis and optimization," *IEEE Trans. VLSI syst.*, vol. 4, no. 4, pp. 477–494, 1996. However, these studies did not mention moment computations for coupled RLC trees.

The technique, "Crosstalk estimated in high-speed VLSI interconnect using coupled RLC-tree models", which is proposed in *Proc. 2002 IEEE Asia Pacific Conference on Circuits and Systems*, comprised the initial research. Although the moment computation formulae for coupled REC trees have been developed, the technique about efficiently constructing the crosstalk estimation model was not provided. Also, the stability of the model was still not analyzed.

SUMMARY OF THE INVENTION

The present invention discloses a method for efficiently estimating crosstalk noise of high-speed VLSI interconnects. In the invention, high-speed VLSI interconnects are modeled as RLC coupled trees. The inductive crosstalk noise waveform can be accurately estimated in an efficient manner using the linear time recursive moment computation technique in conjunction with the projection-based order reduction method. Recursive formulas of moment computations for coupled RC trees are derived with considering both self inductances and mutual inductances.

Further benefits and advantages of the present invention will become apparent after a careful reading of the detailed description with appropriate reference to the accompanying drawings.

BRIEF DESCRIPTION OF THE DRAWINGS

FIG. 4 illustrates the moment model of two coupled R-L branches: (a) original circuit model, and (b) equivalent moment model;

FIG. 5 represents the recursive moment computation algorithm for lumped coupled RLC trees; and FIG. 6 illustrates three types of coupled RLC trees: (a) two lines, (b) tree 1, and (c) tree 2, wherein the lengths of the coupling lines of net 1 belong to the set L1={1, 2, 3, 4, 5} (mm) and those of net 2 are also in the set L2={1, 2, 3, 4, 5} (mm), and the latter are never longer than the former.

DETAILED DESCRIPTION OF THE INVENTION

Figure 1:
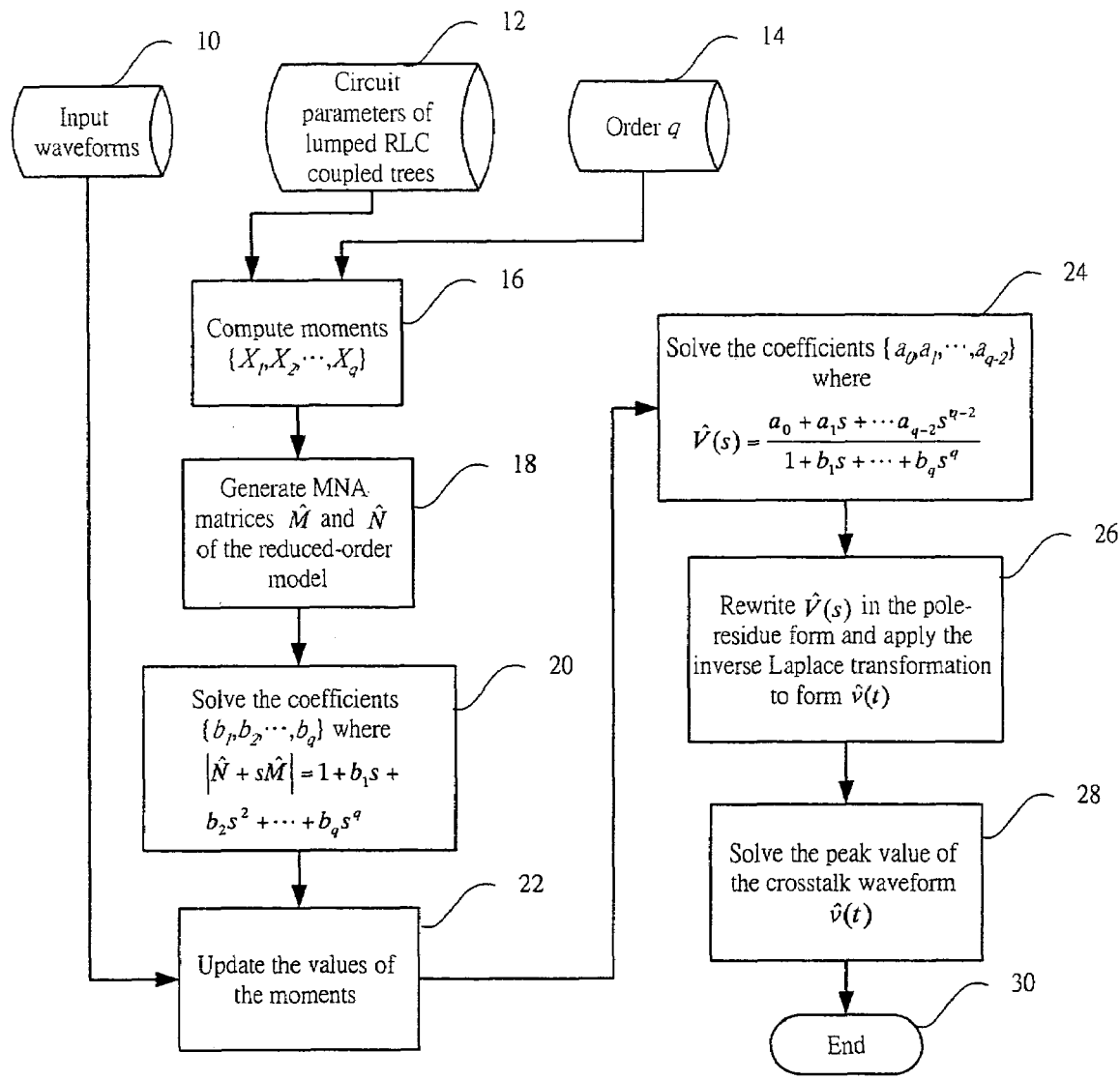
FIG. 1 represents a flow chart of the method of estimating crosstalk noise in lumped RLC coupled interconnects in accordance with the present invention.

FIG. 1 shows the flow chart of the crosstalk estimation algorithm in the disclosed invention. Three input files should be included, which contain input signal 10, circuit parameters of the lumped coupled RLC trees 12, and the order q of the reduced-order model 14. Initially, in step 16, calculate q-order moments $\{X_1, X_2, \ldots, X_q\}$. Then, in step 18, construct q-order reduced-order MNA matrices $\hat{M}$ and $\hat{N}$. In step 20, calculate the coefficients $\{b_1, b_2, \ldots, b_q\}$ of the equation $|\hat{N}+s\hat{M}|=1+b_1 s+b_2 s^2+ \ldots +b_q s^q$. Step 22 updates the values of the moments according to the input signal. Step 24 calculates the coefficients $\{a_0, a_1, \ldots, a_{q-2}\}$ of the transfer function of the qth-order reduced-order model $$\hat{V}(s) = \frac{a_0 + a_1 s + \ldots + a_{q-2} s^{q-1}}{1 + b_1 s + \ldots + b_{q-1} s^{q-1} + b_q s^q}$$

by using the moments obtained in step 22. Then $\hat{V}(s)$ is reformulated by the pole-residue form $$\hat{V}(s) = \frac{k_1}{s-p_1} + \frac{k_2}{s-p_2} + \ldots + \frac{k_q}{s-p_q}$$

and the resultant time-domain crosstalk noise will be $\hat{v}(t)=k_1 e^{p_1 t}+k_2 e^{p_2 t}+ \ldots +k_q e^{p_q t}$ by applying the inverse Laplace transform in step 26. Finally, step 28 estimates the peak value the crosstalk noise and the algorithm is terminated in step 30.

The dynamics of RLC coupled trees can also be represented by the following MNA formula:

$$\left(s\underbrace{\begin{bmatrix} C & 0 \\ 0 & L \end{bmatrix}}_{M} + \underbrace{\begin{bmatrix} G & E \\ -E^T & R \end{bmatrix}}_{N}\right) \underbrace{\begin{bmatrix} V(s) \\ I(s) \end{bmatrix}}_{X(s)} = B \quad (1)$$

$$Y(s) = P^T X(s),$$

where $M, N \in R^{n \times n}$, $B \in R^{n \times m}$, and $P \in R^{n \times p}$. The matrix M contains the capacitance matrix C and the inductance matrix L; the matrix N comprises the conductance matrix G and the resistance matrix R and the incident matrix E. The matrix $X(s)$ represents the transfer functions of the state variables. The matrix $B=[b_1 \, b_2 \, \ldots \, b_m]$ indicates that the circuit has m aggressor trees and each $b_i (1 \leq i \leq m)$ represents the contribution of the i th independent voltage source. $V(s) \in R^{(n/2) \times m}$ denotes voltages across the grounding capacitances and $I(s) \in R^{(n/2) \times m}$ contains currents flowing through R-L branches of the aggressor and victim trees. Since the number of nodes and that of R-L branches are equal, n/2 is a positive integer number. $Y(s)$ stands for the transfer functions at the far end nodes of the victim trees chosen from $X(s)$ by P. For simplicity, it is assumed that the circuit has only one aggressor tree and once a victim tree is concerned, m=p=1.

If we expand $X(s)$ in power series, $X(s)=\Sigma_i X_i s^i$, the i th-order moment of $X(s)$ about s=0, $X_i$, can be obtained. With the aid of Eq. (1), the recursive formula for moment $X_i$ can be established as follows:

$NX_0=B$ $NX_{i+1}=-MX_i$, for $i=0,1, \ldots, q$ \quad (2)

In particular, for special lumped RLC-tree structures, efficient recursive moment computation formulae are disclosed in the invention to neglect the above expensive matrix computations. The details will be shown as follows.

Moment Computations for Lumped Coupled RLC-Tree Interconnect Models

A set of coupled RLC trees contains several individual RLC trees with capacitive and inductive couplings to each other. Each RLC tree comprises floating resistors and self inductors from the ground and capacitors connecting between nodes on the tree and the ground. A lumped RLC-tree model excludes transmission lines, couplings, and resistor loops. Each transmission line should be approximated by lumped RLC circuits with a sufficiently large number of RLC segments. A tree with a voltage source connected to its root is called an aggressor tree; by contrast, trees whose roots are grounding are called victim trees. By ignoring self inductances and mutual inductances, the conventional coupled RC-tree models are obtained. In this invention, coupled interconnects are modeled as coupled RLC trees for analyzing the crosstalk noises.

Figure 2:
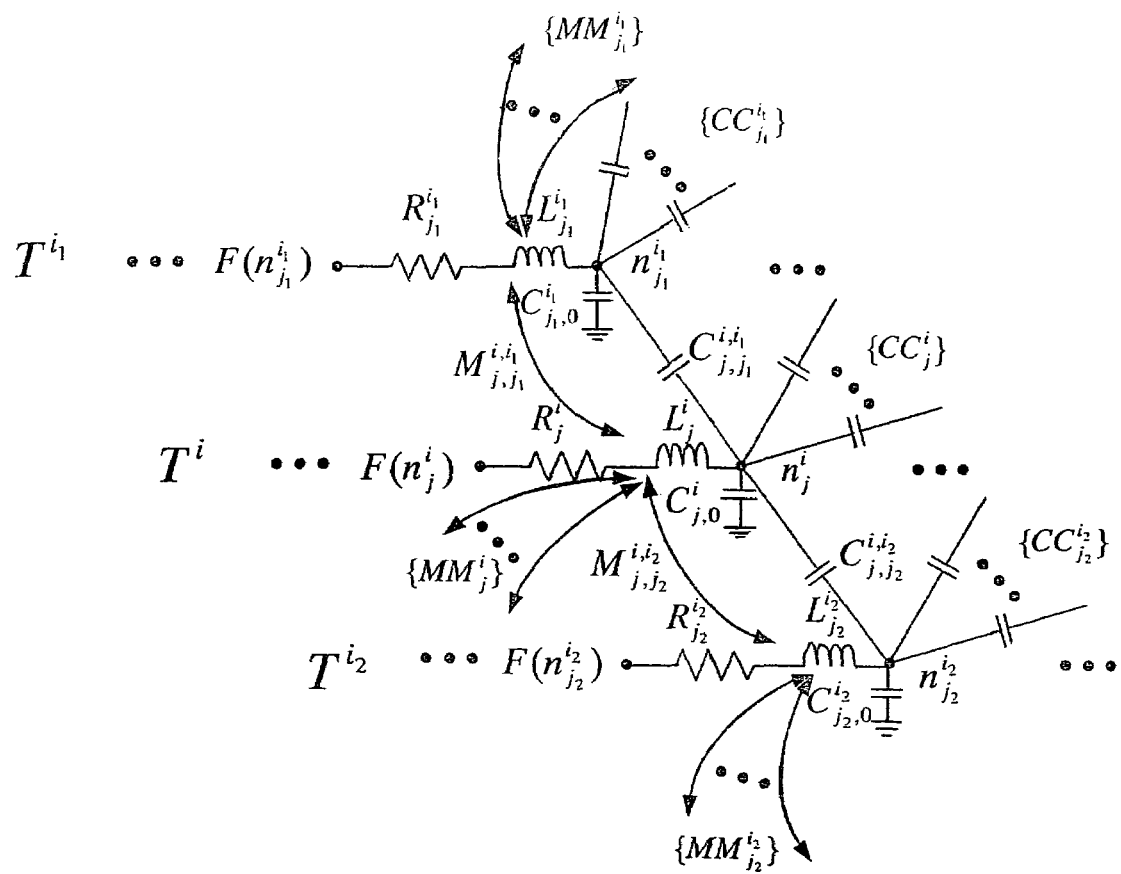
FIG. 2 illustrates a typical section of tree T.sup.i in coupled RLC trees.

To clearly describe the complex coupled RLC-tree structures, the invention first introduces the notations. Consider a typical section of tree $T^i$ in coupled RLC trees shown in FIG. 2, where $n_j^i$ is the j th node in the tree $T^i$ and $F(n_j^i)$ is the corresponding father node of $n_j^i$. Node $n_0^i$ is the root of $T^i$ and $F(n_0^i)=\phi$. $N^i$ is the set of the non-root nodes in $T^i$. $S(n_j^i)$ denotes the set of the son nodes of $n_j^i$.

Each root node has only one son node. $R_j^i$ and $L_j^i$ are the resistance and the inductance connected between $n_j^i$ and $F(n_j^i)$. $C_{j,0}^i$ is the capacitance connected between $n_j^i$ and the ground.

$$C_{j,j_1}^{i,i_1}$$

denotes the coupling capacitance between $n_j^i$ and $n_{j_1}^{i_1}$. $Mj,j_1^{i,i_1}$ is the mutual inductance between $L_j^i$ and $L_{j_1}^{i_1}$. $CC_j^i$ denotes the set of coupling capacitances connected to $MM_j^i$ is the set of mutual inductances coupled to $L_j^i$. In general, the coupling effect, especially with inductive couplings, is not restricted to arising between two closest neighbors. Therefore, the proposed method will address the comprehensive circumstances that each set $CC_j^i$ and $MM_j^i$ may include several coupling capacitances and mutual inductances. $P_{jk}^i$ is defined as the common path of the path $P_j^i$ from $n_j^i$ to the root of $T^i$ and of the path $P_k^i$ from $n_k^i$ to the root of $T^i$. The total resistance $R_{jk}^i$ and the total inductance $L_{jk}^i$ along the path $P_{jk}^i$ are defined as the sum of the resistances and the sum of the self inductances along the path $P_{jk}^i$, namely, $R_{jk}^i=\Sigma_{n_j^i \in P_{jk}^i} R_j^i$ and $L_{jk}^i=\Sigma_{n_j^i \in P_{jk}^i} L_j^i$. The total capacitance $C_{jT}^i$ at the node $n_j^i$ is defined as the sum of capacitances connected to the node $n_j^i$, that is, $C_{jT}^i=C_{j,0}^i+\Sigma_{C_{j,j_1}^{i,i_1} \in CC_j^i} C_{j,j_1}^{i,i_1}$. The set of ancestor nodes of $n_j^i$, defined as $A(n_j^i)$, covers the nodes on the path $P_{F(j)}^i$ from $F(n_j^i)$ to the root of $T^i$. Let $\hat{A}(n_j^i)=\{\{A(n_j^i)-n_0^i\}\cup n_j^i\}$. Conversely, $D(n_j^i)=\{n_x^i|n_j^i \in A(n_x^i)\}$ denotes the set of descendant nodes of $n_j^i$. We also define $\hat{D}(n_j^i)=\{n_j^i \cup D(n_j^i)\}$. The shortest path length through couplings from the aggressor tree is denoted as $d_i$, called the depth of tree $T^i$. For example, if $T^{i_1}$ is the aggressor tree in FIG. 2, then depth $d_{i_1}=1$ and depth $d_i=2$.

Let $V_j^i(s)$ be the transfer function of the voltage at node $n_j^i$, and $I_j^i(s)$ be the current flowing through $R_j^i$. In particular, $V_0^i(s)$ represents the voltage at root $n_0^i$, where $V_0^i(s)=1$ means that a voltage source is connected between $n_0^i$ and the ground and otherwise $V_0^i(s)=0$. By expanding $V_j^i(s)$ and $I_j^i(s)$ in power series, we have $$V_j^i(s) = \sum_{k=0}^{\infty} V_{j,k}^i s^k \text{ and } I_j^i(s) = \sum_{k=0}^{\infty} I_{j,k}^i s^k.$$

is called the k th-order voltage moment of $V_j^i(s)$, and $I_{j,k}^i$ is called the k th-order current moment of $I_j^i(s)$. The conventional Elmore delay of $n_j^i$ is defined as the first-order voltage moment $-V_{j,1}^i$. The aim of this section is to compute moments $V_{j,k}^i$ and $I_{j,k}^i$ for each node $n_j^i$ with a given order k.

Figure 3:
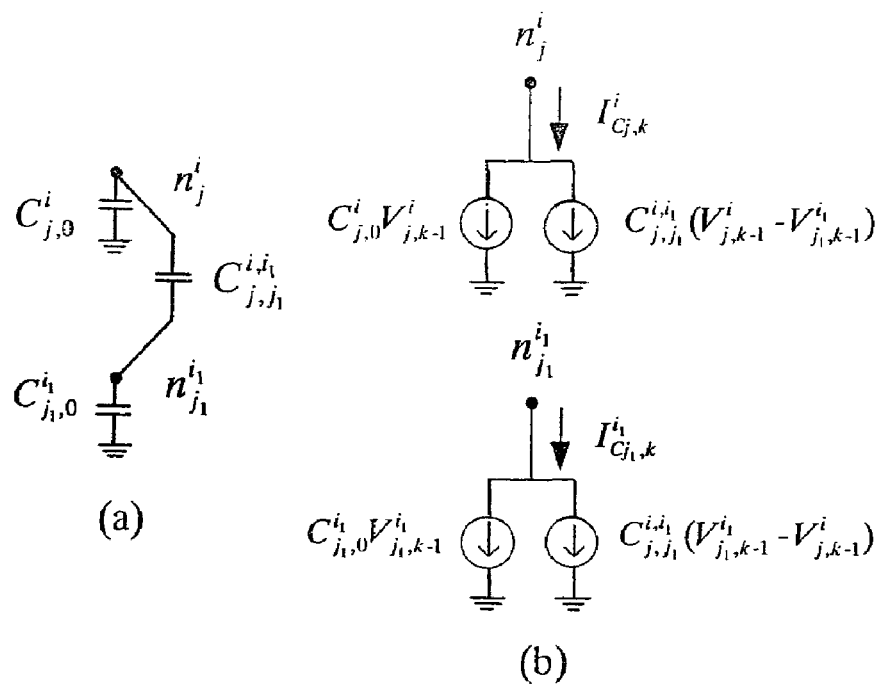
FIG. 3 illustrates the moment model of two capacitive coupled nodes: (a) original circuit model, and (b) equivalent moment model.

For a capacitor C, owing to a capacitive current $I_C(s)=sCV(s)$, its zeroth-order current moment $I_{C,0}$ is equal to zero and the k th-order (k>0) current moment $I_{C,k}=CV_{k-1}$. This implies that the capacitor is equivalent to an open circuit if k=0 or otherwise a current source. For example, consider the circuit with two grounding capacitors and a coupling capacitor in FIG. 3. For k>0, the currents leaving $n_j^i$ and $n_{j_1}^{i_1}$ through capacitors are equal to the following equations:

$$I_{C_j,k}^i = (C_{j,0}^i + C_{j,j_1}^{i,i_1})V_{j,k-1}^i - C_{j,j_1}^{i,i_1} V_{j_1,k-1}^{i_1} \tag{3}$$

$$I_{C_{j_1},k}^{i_1} = (C_{j_1,0}^{i_1} + C_{j,j_1}^{i,i_1})V_{j_1,k-1}^{i_1} - C_{j,j_1}^{i,i_1} V_{j_1,k-1}^{i_1}. \tag{4}$$

As a result, the coupling capacitor can be interpreted as two moment current sources. With extensions to multiple coupling capacitors, each decoupled current moment model can be derived as $$I_{C_j,k}^i = C_{jT}^i V_{j,k-1}^i - \sum_{C_{j,j_1}^{i,i_1} \in CC_j^i} C_{j,j_1}^{i,i_1} V_{j_1,k-1}^{i_1} \tag{5}$$

The k th-order current moment $I_{j,k}^i$ can be obtained by summing up all of the downstream k th-order capacitive current sources:

$$I_{j,k}^i = \sum_{n_x^i \in \hat{D}(n_j^i)} I_{C_x,k}^i \tag{6}$$

In particular, k=0 implies the zero dc current case. The Zeroth-order voltage moment $V_{j,0}^i$ at each node $n_j^i$ is equal to moment $V_{0,0}^i$ at the root node.

In contrast to the moment model of a capacitor, a self inductor L behaves as a short circuit or a voltage source. Suppose that $V_L(s)=sLI(s)$. Then $V_{L,0}=0$ and $V_{L,k}=LI_{k-1}$ for k>0. Referring to the two coupled R-L branches illustrated in FIG. 4, we have the following V-I characteristic relation:

$$V_{F(j)}^i(s) = V_j^i(s) + (R_j^i + sL_j^i)I_j^i(s) + sM_{j,j_1}^{i,i_1} I_{j_1}^{i_1}(s),$$

$$V_{F(j_1)}^{i_1}(s) = V_{j_1}^{i_1}(s) + (R_{j_1}^{i_1} + sL_{j_1}^{i_1})I_{j_1}^{i_1}(s) + sM_{j,j_1}^{i,i_1} I_j^i(s).$$

By expanding each voltage and current about s=0 and collecting the coefficients of $s^k$, the k th-order voltage moments can be obtained:

$$V_{F(j),k}^i = V_{j,k}^i + R_j^i I_{j,k}^i + L_j^i I_{j,k-1}^i + M_{j,j_1}^{i,i_1} I_{j_1,k-1}^{i_1},$$

$$V_{F(j_1),k}^{i_1} = V_{j_1,k}^{i_1} + R_{j_1}^{i_1} I_{j_1,k}^{i_1} + L_{j_1}^{i_1} I_{j_1,k-1}^{i_1} + M_{j,j_1}^{i,i_1} I_{j,k-1}^i.$$

as shown in FIG. 4(b). Also, the mutual inductor is decoupled and equivalent to two voltage sources on tree $T^i$ and $T^{i_1}$. Extensions to multiple mutual inductors are also possible. In this case, each $V_{F(j),k}^i$ can be rewritten as $$V_{F(j),k}^i = V_{j,k}^i + R_j^i I_{j,k}^i + L_j^i I_{j,k-1}^i + \sum_{M_{j,j_1}^{i,i_1} \in MM_j^i} M_{j,j_1}^{i,i_1} I_{j_1,k-1}^{i_1}. \tag{7}$$

By repeatedly substituting Eq. (7) upstream, the k th-order (k>0) moment $V_{j,k}^i$ of the non-root voltage $V_j^i(s)$ (j≠0) can be obtained as follows:

$$V_{j,k}^i = -\sum_{n_r^i \in A(n_j^i)} \left( R_r^i I_{r,k}^i + L_r^i I_{r,k-1}^i + \sum_{M_{r,r_1}^{i,i_1} \in MM_r^i} M_{r,r_1}^{i,i_1} I_{r_1,k-1}^{i_1} \right). \quad (8)$$

If the common path $P_{pj}^i$ between nodes $n_p^i$ and $n_j^i$ is concerned for each $n_p^i \in N^i$, the above equation can be rewritten as $$V_{j,k}^i = -\sum_{n_p^i \in N^i} \left( R_{pj}^i I_{C_p,k}^i + L_{pj}^i I_{C_p,k-1}^i \right) - \sum_{n_r^i \in A(n_j^i)} \sum_{M_{r,r_1}^{i,i_1} \in MM_r^i} M_{r,r_1}^{i,i_1} I_{r_1,k-1}^{i_1}. \quad (9)$$

As a result, the analytical formula for voltage moments at each node can be established as follows:

$$V_{j,k}^i = V_{RC_{j,k}}^i + V_{LC_{j,k}}^i + V_{MC_{j,k}}^i, \text{ where} \quad (10)$$

$$V_{RC_{j,k}}^i = -\sum_{n_p^i \in N^i} R_{pj}^i \left( C_{pT}^i V_{p,k-1}^i - \sum_{C_{p,p_1}^{i,i_1} \in CC_p^i} C_{p,p_1}^{i,i_1} V_{p_1,k-1}^{i_1} \right)$$

$$V_{LC_{j,k}}^i = -\sum_{n_p^i \in N^i} L_{pj}^i \left( C_{pT}^i V_{p,k-2}^i - \sum_{C_{p,p_1}^{i,i_1} \in CC_p^i} C_{p,p_1}^{i,i_1} V_{p_1,k-2}^{i_1} \right)$$

$$V_{MC_{j,k}}^i = -\sum_{n_r^i \in A(n_j^i)} \sum_{M_{r,r_1}^{i,i_1} \in MM_r^i}$$

$$M_{r,r_1}^{i,i_1} \left[ \sum_{n_{x_1}^{i_1} \in D(n_{r_1}^{i_1})} \left( C_{x_1 T}^{i_1} V_{x_1,k-2}^{i_1} - \sum_{C_{x_1,x_2}^{i_1,i_2} \in CC_{x_1}^{i_1}} C_{x_1,x_2}^{i_1,i_2} V_{x_2,k-2}^{i_2} \right) \right],$$

and where tree $T^{i_1}$ belongs to the set of neighbor trees of $T^i$; $T^{i_2}$ belongs to the set of neighbor trees of $T^{i_1}$. These terms $V_{RC_{j,k}}^i$, $V_{LC_{j,k}}^i$, and $V_{MC_{j,k}}^i$ have the following physical interpretations. The first term $V_{RC_{j,k}}^i$ is exactly equal to that in coupled RC trees. The second and third terms, $V_{LC_{j,k}}^i$ and $V_{MC_{j,k}}^i$, represent the contributions to moment $V_{j,k}^i$ from self inductances and mutual inductances on path $P_j^i$, respectively. It is worthy of mentioning that the k th-order voltage moment only depends on the (k−1)st- and (k−2)nd-order ones. The Elmore delay at $n_j^i$ can be calculated as $-V_{j,1}^i = \sum_{n_p^i \in N^i} R_{pj}^i C_{pT}^i$, if $T^i$ is an aggressor tree and $n_j^i$ is not the root of $T^i$. Self inductances and mutual inductances in coupled RLC trees will not affect the Elmore delay.

Now the invention considers the rules of the signs of the voltage moments for coupled RLC trees. As indicated in Q. Yu and E. S. Kuh, "Moment computation of lumped and distributed coupled RC trees with application to delay and crosstalk estimation," *Proceedings of the IEEE*, vol. 89, no. 5, pp. 772–788, 2001, the sign of $V_{j,k}^i$ for coupled RC trees can be determined by that of $V_{j,k-1}^i$ and the directions of current moments through coupling capacitances. However, the signs of voltage moments for the coupled RLC-tree models will be more complex than those for coupled RC-tree models. That is, $V_{j,k-1}^i$ in Eq. (10) may depend not only on $V_{j,k-1}^i$ but also on $V_{j,k-2}^i$ and self/mutual inductances. The inductive components, i.e., $V_{LC_{j,k}}^i$ and $V_{MC_{j,k}}^i$ in Eq. (10), will alter the original sign rules. From Eq. (10), it can be observed that if $V_{j,k}^i$ does not exist or $V_{j,k}^i = 0$, the magnitude of $V_{j,k}^i$ for coupled RLC trees is equal to that for coupled RC trees. Extending the observations, we represent the following proposition:

Proposition 1: For any node on coupled RLC trees, the signs of the voltage moments have the following relationships:

1. $V_{j,0}^1 = 1$ and $V_{j,1}^1 < 0$ for any node $n_j^1$ on the aggressor tree $T^1$; and 2. $V_{j,k}^i = 0$ for $k < d_i$, and $V_{j,d_i}^i > 0$ for any node $n_j^i$ on the victim tree $T^i$ with depth $d_i > 0$.

The proposition will be applied to analyze the stability of the reduced-order models of coupled RLC trees.

Stability of reduced-order models can not be guaranteed for general RLC circuits, even for the simplest models (i.e., one-pole model and two-pole model). For example, an one-pole model (see A. Vittal, L. H. Chen, M. Marek-Sadowska, K. P. Wang, and S. Yang, "Crosstalk in VLSI interconnects," *IEEE Trans. Computer-Aided Design*, vol. 18, pp. 1817–1824, 1999) can be represented as follows:

$$\hat{V}(s) = \frac{a_0}{1 + b_1 s} = V_1 + V_2 s.$$

After simple manipulations, we have $a_0 = V_1$, $b_1 = -V_2/V_1$, and the pole is $p_1 = V_1/V_2$. From Proposition 1, we have known that $V_1$ is positive but $V_2$ may be nonnegative due to significant inductive effects. Thus, the one-pole model may be unstable.

We will derive recursive formulas for computing the k th-order moment at node $n_j^i$ from the k th-order moment at the corresponding node $F(n_j^i)$. The recursive processes will be proceeded by calculating both current moments $I_{j,k}^i$ and voltage moments $V_{j,k}^i$ recursively. First, by accumulating capacitive current sources at each level of $D(n_j^i)$, the set of descendant nodes of $n_j^i$, Eq. (6) can be rewritten $$I_{j,k}^i = I_{C_{j,k}}^i + \sum_{n_x^i \in S(n_j^i)} I_{x,k}^i. \quad (11)$$

Thus, each k th-order current moment can be calculated upstream from leaves of the coupled RLC trees to their roots by using the (k−1)st-order voltage moments in Eq. (5).

Similarly, the k th-order moment $V_{j,k}^i$ can be derived from Eq. (7)

$$V_{j,k}^i = V_{F(j),k}^i - R_j^i I_{j,k}^i - L_j^i I_{j,k-1}^i - \sum_{M_{j,j_1}^{i,i_1} \in MM_j^i} M_{j,j_1}^{i,i_1} I_{j_1,k-1}^{i_1}, \quad (12)$$

$$= V_{C_{j,k}}^i - V_{LM_{j,k}}^i$$

where $V_{C_{j,k}}^i = V_{F(j),k}^i - R_j^i I_{j,k}^i$ represents the original computations of $V_{j,k}^i$ in coupled RC trees;

$$V_{LM_{j,k}}^i = L_j^i I_{j,k-1}^i + \sum_{M_{j,j_1}^{i,i_1} \in MM_j^i} M_{j,j_1}^{i,i_1} I_{j_1,k-1}^{i_1}$$

indicates contributions of self inductances and mutual inductances on $V_{j,k}^i$, respectively. In comparison with the formulas of coupled RC and RLC trees, it can be concluded that the k th-order moment $V_{j,k}^i$ depends not only on the k th-order moment $I_{j,k}^i$ but on the (k−1)st-order moments $I_{j,k-1}^i$ and $I_{j_1,k-1}^{i_1}$. Eq. (12) indicates that each k th-order voltage moments can be calculated downstream from the roots of the coupled RLC trees to their leaves if all the k th- and (k−1)st-order current moments are solved.

As shown FIG. 5, Algorithm 1 embodied in Eqs. (5), (11), and (12) is the *recursive moment computation algorithm*. The main function MomCom contains three sub-functions ZerothOrderMom, Current, and Voltage$_{LM}$. We extend the algorithm for coupled RC trees disclosed in Q. Yu and E. S. Kuh, "Moment computation of lumped and distributed coupled RC trees with application to delay and crosstalk estimation," *Proceedings of the IEEE*, vol. 89, no. 5, pp. 772–788, 2001, with considering both self inductive effects and mutual inductive effects. Only the function *Voltage$_{LM}$* is needed to be modified in calculating the term $V_{LM_{j,k}}^i$. The computational complexity of the algorithm with consideration of RC circuits is equal to O(nk), where n is the number of nodes in the circuit and k represents the maximum order. Since incorporating floating self and mutual inductances do not change the number of nodes, Algorithm 1 still retains the linear order computational complexity.

Crosstalk Noise Estimations for Coupled RLC Trees

The purpose of crosstalk estimations is to solve the peak voltage value at the far end node in the victim tree efficiently and accurately. As interconnects are typically of very large size and high-order, model-order reduction is a necessity for efficient crosstalk estimations. In this section, we will utilize moment matching techniques initially to establish a reduced-order system. Then, we will use the reduced-order system to estimate the crosstalk metric.

In order to overcome the stability issue of the qth-order reduced-order model, the projection-based model-order reduction algorithms are recommended. A guaranteed stable reduced-order model will be generated for crosstalk noise estimations. By applying the congruence transformation, the original n-dimensional state vector can be projected to a reduced q-dimensional one, where q<<n.

Step 18 aims to establish a stable reduced-order model $$(\hat{N} + s\hat{M})\hat{X}(s) = \hat{B}.$$

The congruence transformation Q is used to project the n-dimensional original state vector to a reduced-order q-dimensional one: $\hat{X} = Q^T X$. Thus, we have the following MNA matrices for the reduced-order model:

$$\hat{N} = Q^T N Q, \ \hat{M} = Q^T M Q, \ \hat{B} = Q^T B \text{ and } \hat{P} = Q^T P$$

where $\hat{M}, \hat{N} \in \mathbb{R}^{q \times q}$ and $\hat{X}, \hat{B}, \hat{P}, \in \mathbb{R}^q$. $\hat{X}_i$, the i th-order moment of the reduced-order network $\hat{X}(s)$, can also be defined. The conventional moment matching technique implies that if each moment $\hat{X}_i$ lies in the column space of Q, the first q moments of $\hat{X}(s)$ will indeed be equal to those of X(s), as disclosed in J. M. Wang, C. C. Chu, Q. Yu, and E. S. Kuh, "On projection-based algorithms for model-order reduction of interconnects," *IEEE Trans. Circuits Syst. I*, vol. 49, no. 11, pp. 1563–1585, 2002. That is, $\hat{X}_i = \hat{X}_i$ for i=0,1, . . . ,q−1. In particular, if each column $Q_i$ in Q is equal to the system moment $X_{i-1}$ (i.e., $Q = [X_0 X_1 \ldots X_{q-1}]$), each entry of $\hat{M}$ and $\hat{N}$ can be described as follows:

$$\hat{m}_{ij} = X_{i-1}^T M X_{j-1} \text{ and } \hat{n}_{ij} = X_{i-1}^T N X_{j-1}. \quad (13)$$

Entries of $\hat{M}$ and $\hat{N}$ have subtle relationships, which are summarized in the following proposition.

Proposition 2: Let matrices $\hat{M}$ and $\hat{N}$ be the MNA matrices for the reduced-order model that are generated by the congruence transformation Q, where $Q = [X_0 X_1 \ldots X_{q-1}]$. Thus, entries of $\hat{M}$ and $\hat{N}$ have the following subtle relationships: 1. $\hat{m}_0 = -X_{i-1}^T N X_j = -\hat{n}_{i,j+1}$ and 2. $m_{ij} = X_{j-1}^T M X_{i-1} = -X_{j-1}^T N X_i = -\hat{n}_{j,i+1}$.

Therefore, except for $\hat{m}_{kk}$, all other entries of $\hat{M}$ can be obtained directly from $\hat{N}$. The remaining task is to calculate each entry in $\hat{N}$ and the entry $\hat{m}_{kk}$. By exploring symmetric characteristics of matrix M, the entry $\hat{n}_{ij}$ can be calculated by using Eq. (2). Suppose that $X_{j-2} = [V_{j-2}^T I_{j-2}^T]^T$ and $MX_{j-2} = [V_{j-2}^T C \ I_{j-2}^T L]^T$, where vector $V_{j-2}$ and vector $I_{j-2}$ are the (j−2)nd-order moment of V(s) and I(s). $CV_{j-2}$ and $LI_{j-2}$ can be calculated easily. For general cases, it can be derived that $$CV_{j-2} = \lfloor I_{C_{x,j-1}} \rfloor_{x=1}^{t/2} \text{ and } LI_{j-2} = \lfloor V_{LM_{x,j-2}} \rfloor_{x=1}^{t/2}.$$

It is worthy of mentioning that these moments are intermediates in Algorithm 1 without any additional costs. Therefore, all entries in $\hat{N}$ and $\hat{m}_{kk}$ can be calculated by multiplying the corresponding moment vectors rather than constructing M and N explicitly.

Further simplifications about entries in the matrix $\hat{N}$ are still possible. The following proposition presents this result.

Proposition 3: With the same conditions as Proposition 2, entries in the first column and the first row of matrices $\hat{N}$ have the relationships shown as below:

1. $\hat{n}_{11} = 0$

2. $\hat{n}_{i1}$ (i>1), denoted as $I_{1,i-1}^a$, is equal to the (i−1)st-order moment of the current entering node $n_1^a$ in the aggressor tree $T^a$; and 3. $\hat{n}_{1i} = -\hat{n}_{i1}$.

By exploring symmetric characteristic of matrix M, it is straightforward to see that entries in matrix $\hat{N}$ can also be related as follows:

$$\hat{n}_{ij} = -X_{i-1}^T M X_{j-2}$$
$$= -X_{j-2}^T M X_{i-1}$$
$$= \hat{n}_{j-1,i+1} \text{ for } i \geq 2 \text{ and } j \geq i+2.$$

For illustrational purpose, let symbol ○ represent the entries of matrix $\hat{N}$ that need to be calculated additionally using Algorithm 1, and symbol X denote the entries of matrix $\hat{N}$ that can be simplified by Proposition 3 and Corollary 1. Entries in $\hat{N}$ can be displayed as follows:

$$\begin{bmatrix} X & X & X & X & X & X & \cdots & X \\ O & O & O & X & X & X & \cdots & X \\ O & O & O & O & X & X & \cdots & X \\ O & O & O & O & O & X & \cdots & X \\ O & O & O & O & O & O & \ddots & X \\ O & O & O & O & O & O & \ddots & X \\ \vdots & \vdots & \vdots & \vdots & \vdots & \vdots & & \vdots \\ O & O & O & O & O & O & \ddots & X \\ O & O & O & O & O & O & \cdots & O \\ O & O & O & O & O & O & \cdots & O \end{bmatrix}.$$

Thus the number of entries that need to be calculated in a q×q matrix $\hat{N}$ can be counted as follows:

$$\begin{cases} 0, & \text{if } q = 1, \\ 2, & \text{if } q = 2, \\ \frac{1}{2}(2q+1)(q-1)-1, & \text{if } q \geq 3. \end{cases} \quad (17)$$

Let $V(s)$ and $\hat{V}(s)$ be the step responses of the original model and the desired reduced-order model, respectively. The technique disclosed in M. Kuhlmann and S. S. Sapatnekar, "Exact and efficient crosstalk estimation," *IEEE Trans. Computer-Aided Design*, vol. 20, no. 7, pp. 858–866, 2001, suggested an appropriate formula of the q-pole reduced-order model $\hat{V}(s)$ as follows (as in step 24):

$$\hat{V}(s) = \frac{a_0 + a_1 s + \ldots + a_{q-2} s^{q-1}}{1 + b_1 s + \ldots + b_{q-1} s^{q-1} + b_q s^q}, \quad (14)$$

which causes the approximate crosstalk voltage $\hat{v}(t)$ to be zero for t converging to 0 and ∞. Conventional moment matching techniques are often used to solve the unknown coefficients $a_i(0 \leq i \leq q-2)$ and $b_j(1 \leq j \leq q)$ by using the front 2q−1 moments $\{V_1, V_2, \ldots, V_{2q-1}\}$ of the original model:

$$V(s) = V_1 + V_2 s + V_3 s^2 + \ldots + V_{2q-1} s^{2q-2} + \ldots,$$

In step 26, Eq. (14) can also be rewritten as the pole-residue form $$\hat{V}(s) = \frac{k_1}{s - p_1} + \frac{k_2}{s - p_2} + \ldots + \frac{k_q}{s - p_q}, \quad (15)$$

where $p_i$ for i=1,2, . . . ,q are poles of $\hat{V}(s)$ and each $k_i$ is the residue corresponding to the pole $p_i$. By applying the inverse Laplace transformation, we have $$\hat{v}(t) = k_1 e^{p_1 t} + k_2 e^{p_2 t} + \ldots + k_q e^{p_q t}.$$

In step 28, the peak value of the crosstalk waveform will occur at time $t = t_m$ where $\hat{v}'(t_m) = 0$ and $\hat{v}''(t_m) < 0$.

In the previous moment computations, the input waveform is assumed to be a step function. However, the input signal in step 10 may be with an arbitrary waveform. Let the updated V(s) be $$V(s) = m_1' s + m_2' s^2 + m_3' s^3 + m_4' s^4 + m_5' s^5 \ldots \quad (16)$$

For example, suppose that the input signal is a ramp function as follows:

$$v(t) = t/\tau u(t) - t/\tau u(t-\tau) + u(t-\tau),$$

where u(t) is a step function and 1/τ is the slope of the ramp function.

Applying the Laplace transform, we have $$V(s) = \frac{1}{s}\left(1 - \frac{\tau}{2}s + \frac{\tau^2}{6}s^2 - \frac{\tau^3}{24}s^3 + \frac{\tau^4}{120}s^4 + \ldots\right). \quad (17)$$

Comparing the coefficients of Eqs. (16) and (17) concludes $$m_1' = m_1$$

$$m_2' = m_2 - \frac{\tau}{2} m_1$$

$$m_3' = m_3 - \frac{\tau}{2} m_2 + \frac{\tau^2}{6} m_1$$

$$m_4' = m_4 - \frac{\tau}{2} m_3 + \frac{\tau^2}{6} m_2 - \frac{\tau^3}{24} m_1$$

$$m_5' = m_5 - \frac{\tau}{2} m_4 + \frac{\tau^2}{6} m_3 - \frac{\tau^3}{24} m_2 + \frac{\tau^4}{120} m_1$$

$$\vdots$$

ILLUSTRATIVE EXAMPLES

To verify the accuracy of the proposed method, three coupling circuits but not limiting examples shown in FIG. 6 are studied for crosstalk estimations. The squares represent the roots of the trees and the circles stand for the leaves of the trees for crosstalk estimations. Among all circuits, the line parameters are resistance: 35 Ω/cm, grounding capacitance: 5.16 pF/cm, self inductance: 3.47 nH/cm, coupling capacitance: 6 pF/cm, and mutual inductance: 1 nH/cm. The wire resistance, capacitance and inductance are distributed per 100 μm. The loading of each line is 50 fF. We examine peak values of noises and peak noise occurring time for the cases with different circuit topologies, line lengths, coupling locations, effective driver impedances, and rising times. For the circuits in FIG. 6, the lengths of the coupling line of net 1 belong to the set L1={1,2,3,4,5}(mm) and those of net 2 are also in the set L2={1,2,3,4,5}(mm) that are never longer than the lengths of net 1. Other branches in FIG. 6(*b*)(*c*) are all 1 mm. The topology of each net 1 is fixed. Each net 2 changes the coupling locations and shifts 1 mm each time from alignment at the near end of net 1 to that at the far end of net 1. In each case, net 1 and net 2 are excited independently. Thus, there are total 65 cases for the two-line circuit and 70 cases for the tree 1 and tree 2 circuits. In addition, four effective driver impedance pairs: 3 Ω–3 Ω, 3 Ω–30 Ω, 30 Ω–3 Ωand 30 Ω–30 Ω, which are connected to the near ends of the two nets, are examined. The voltage source connected to the aggressor net is a ramp function with two rising time 0.02 ns and 0.2 ns and with a normalized unit magnitude. Thus, we have total 1640 cases to examine accuracy of the proposed method.

The conventional one-pole model (1P) and two-pole model (2P) and our new method with three-pole model (S3P), four-pole model (S4P), . . . , eight-pole model (S8P) are investigated for comparison studies. Absolute and relative errors of crosstalk peak values in comparison with HSPICE simulation results are summarized in Tables 1 and 2. The corresponding absolute relative errors of crosstalk noise peak value occurrence time are summarized in Tables 3 and 4. Each entry from row 1 to row 24 represents the average error of the cases for different lengths of net 1 and net 2 under a condition of a specific rising time and driver impedance. The entries in the last three rows of each model stand for the maximum, average, and minimum error of the 24 sets in the table. Among 1640 cases, there are 42 cases in which model 1P has unstable poles and 18 cases in which model 2P is unstable. From simulation results, we have the following observations:

1. The models generated by our method perform better than the conventional 1P and 2P models. Thus, these conventional models are no longer appropriate for coupled RLC trees. With increasing order of reduced-order models, the proposed models perform more accurately.

2. From the viewpoints of the absolute error values in Tables 1 and 3, model S3P, whose average errors are smaller than 10%, seems acceptable for use in crosstalk noise estimations. However, referring to the relative error values in Tables 2 and 4, model S3P does not seem to be accurate as expected. For balancing computational efficiency and estimation performance, the S6P model will be recommended.

3. With increasing effective driver impedance and rising time, errors of each model decrease.

Although the invention has been explained in relation to its preferred embodiment, it is to be understood that many other possible modifications and variations can be made without departing from the spirit and scope of the invention as hereinafter claimed.

What is claimed is:

1. A method of estimating crosstalk noise in RLC coupled interconnects, wherein a recursive moment computation is defined by $$I^i_{C_{j,k}} = C^i_{jT} V^i_{j,k-1} - \sum_{C^{i,i_1}_{j,j_1} \in CC^i_j} C^{i,i_1}_{j,j_1} V^{i_1}_{j_1,k-1};$$

$$I^i_{j,k} = I^i_{C_{j,k}} + \sum_{n^i_x \in S(n^i_j)} I^i_{x,k}; \text{ and}$$

$$V^i_{j,k} = V^i_{F(j),k} - R^i_j I^i_{j,k} - L^i_j I^i_{j,k-1} - \sum_{M^{i,i_1}_{j,j_1} \in MM^i_j} M^{i,i_1}_{j,j_1} I^{i_1}_{j_1,k-1},$$

$$= V^i_{C_{j,k}} - V^i_{LM_{j,k}}$$

where $V^i_{C_{j,k}} = V^i_{F(j),k} - R^i_j I^i_{j,k}$ represents original computations of $V^i_{j,k}$ in coupled RC trees, where $$V^i_{LM_{j,k}} = L^i_j I^i_{j,k-1} + \sum_{M^{i,i_1}_{j,j_1} \in MM^i_j} M^{i,i_1}_{j,j_1} I^{i_1}_{j_1,k-1}$$

indicates contributions of self inductances and mutual inductances on $V^i_{j,k}$, and where A. j represents tree $T^i$;
B. $n^i_j$ is the jth node in the free $T^i$;
C. $F(n^i_j)$ is a corresponding father node of $n^i_j$;
D. $N^i$ is a set of the non-root nodes in $T^i$;
E. $S(n^i_j)$ denotes a set of the son nodes of $n^i_j$;
F. $R^i_j$ and $L_{Pj}{}^i$ are resistance and inductance connected between $n^i_j$ and $F(n^i_j)$;
G. $C_{j,0}{}^i$ is capacitance connected between $n^i_j$ and the ground;
H.

$$C^{i,i_1}_{j,j_1}$$

denotes coupling capacitance between $n^i_j$ and $n^{i_1}_{j_1}$;
I.

$$M^{i,i_1}_{j,j_1}$$

is mutual inductance between $L^i_j$ and $L^{i_1}_{j_1}$;
J. $CC^i_j$ denotes a set of coupling capacitances connected to $n^i_j$;
K. $MM^i_j$ is a set of mutual inductances coupled to $L^i_j$;
L. $P^i_{jk}$ is defined as a common path of path $P^i_j$ from $n^i_j$ to root of $T^i$ and of path $P^i_k$ from $n^i_k$ to the root of $T^i$;
M. $R_{jk}{}^i$ and $L_{jk}{}^i$ are total resistance and total inductance along path $P_{jk}{}^i$, defined as a sum of resistances and a sum of self inductances along the path $P_{jk}{}^i$, that $$R^i_{jk} = \sum_{n^i_j \in P^i_{jk}} R^i_j \text{ and } L^i_{jk} = \sum_{n^i_j \in P^i_{jk}} L^i_j;$$

N. $C_{jT}{}^i$ is total capacitance at the node $n^i_j$, defined as a sum of capacitances connected to the node $m^i_j$, that is, $$C^i_{jT} = C^i_{j,0} + \sum_{C^{i,i_1}_{j,j_1} \in CC^i_j} C^{i,i_1}_{j,j_1};$$

O. $A(n^i_j)$ is a set of ancestor nodes of $n^i_j$, covering nodes on path $P_{F(j)}{}^i$ from $F(n^i_j)$ to the root of $T^i$;
P. $\hat{A}(n^i_j) = \{\{A(n^i_j) - n_0{}^i\} \cup n^i_j\}$;
Q. $D(n^i_j) = \{n^i_x | n^i_j \in A(n^i_j)\}$ denotes a set of descendant nodes of $n^i_j$;
R. $\hat{D}(n^i_j) = \{n^i_j \cup D(n^i_j)\}$;
S. $V^i_j(s)$ is a transfer function of voltage at node $n^i_j$;
T. $I^i_j(s)$ is one of current flowing through $R^i_j$;
U. $V_{j,k}{}^i$ is called the kth-order voltage moment of $V^i_j(s)$; and
V. $I_{j,k}{}^i$ is called the kth-order current moment of $I^i_j(s)$.

2. The method as claimed in claim 1, further comprising an analytical formula for voltage moments at each node, the analytical formula is defined by $$V^i_{j,k} = V^i_{RC_{j,k}} + V^i_{LC_{j,k}} + V^i_{MC_{j,k}}, \text{ where}$$

$$V^i_{RC_{j,k}} = -\sum_{n^i_p \in N^i} R^i_{pj} \left( C^i_{pT} V^i_{p,k-1} - \sum_{C^{i,i_1}_{p,p_1} \in CC^i_p} C^{i,i_1}_{p,p_1} V^{i_1}_{p_1,k-1} \right)$$

$$V^i_{LC_{j,k}} = -\sum_{n^i_p \in N^i} L^i_{pj} \left( C^i_{pT} V^i_{p,k-2} - \sum_{C^{i,i_1}_{p,p_1} \in CC^i_p} C^{i,i_1}_{p,p_1} V^{i_1}_{p_1,k-2} \right)$$

-continued $$V^i_{MC_{j,k}} = -\sum_{n^i_r \in A(n^i_j)} \sum_{M^{i,i1}_{r,r1} \in MM^i_r} M^{i,i1}_{r,r1} \left[ \sum_{n^{i1}_{x1} \in D(n^{i1}_{r1})} \left( C^{j1}_{x_1} T V^{i1}_{x_1,k-2} - \sum_{C^{i1,i2}_{x1,x2} \in CC^{i1}_{x1}} C^{i1,i2}_{x_1,x_2} V^{i2}_{x_2,k-2} \right) \right].$$

3. The method as claimed in claim 1, further comprising MNA matrices, with the MNA matrices containing matrix $\hat{M}$ and $\hat{N}$, and wherein entries of $\hat{M}$ and $\hat{N}$ have the following subtle relationships:
A. $\hat{m}_{ij} = -X_{i-1}^T \hat{N} X_j = -\hat{n}_{i,j+1}$; and
B. $m_{ij} = X_{j-1}^T \hat{M} X_{i-1} = -X_{j-1}^T X_i = -\hat{n}_{j,i+1}$,
where $\hat{M}$ and $\hat{N}$ are crosstalk estimation models; $\hat{m}_{ij}$ and $\hat{n}_{ij}$ represent the ith-row and jth-column entries of $\hat{M}$ and $\hat{N}$, respectively; except for $\hat{m}_{kk}$, all other entries of $\hat{M}$ can be obtained directly from $\hat{N}$; all entries in $\hat{N}$ and $\hat{m}_{kk}$ can be calculated by multiplying the corresponding moment vectors rather than constructing the MNA matrices of original model, $\hat{M}$ and $\hat{N}$, explicitly.

4. The method as claimed in claim 3, wherein the entries in the matrix $\hat{N}$ is defined by
A. $\hat{n}_{i1} = 0$, which is the first-row and first-column entry;
B. $\hat{n}_{i1}(i>1)$, are the first-column entries, which are equal to the (i−1)st-order moment of current $I_{1,i-1}$ entering node $n_1^a$ in aggressor tree $T^a$;
C. $\hat{n}_{1i} = -\hat{n}_{i1}$ are the first-row entries; and
D. other entries $\hat{n}_{ij} = -\hat{M} X_{i-1}^T X_{j-2}$, where $\hat{M}$, a real n×n matrix, matrix containing capacitors and inductors; $X_{i-1}$, a real n×1 vector, containing the (i−1)st circuit moments of all grounding nodes and all resistor-inductor branches, and $MX_{j-2} = \lfloor I_{C_{x,j-1}} V_{LM_{x,j-2}} \rfloor$ for $x = 1, 2, \ldots, n/2$;
by exploring symmetric characteristic of the matrix $\hat{M}$, it is straightforward to see that entries in the matrix $\hat{N}$ can also be related as follows:

$$\hat{n}_{ij} = -X_{i-1}^T M X_{j-2}$$
$$= -X_{j-2}^T M X_{i-1}$$
$$= \hat{n}_{j-1,i+1} \text{ for } i \geq 2 \text{ and } j \geq i+2;$$

for illustrational purpose, let symbols o represent the entries of matrix $\hat{N}$ that need to be calculated additionally using the method in claim 1, and symbol symbols X denote the entries of matrix $\hat{N}$ that can be simplified as shown below; the entries in $\hat{N}$ can be displayed as follows:

$$\begin{bmatrix} X & X & X & X & X & X & \ldots & X \\ O & O & O & X & X & X & \ldots & X \\ O & O & O & O & X & X & \ldots & X \\ O & O & O & O & O & X & \ldots & X \\ O & O & O & O & O & O & \ddots & X \\ O & O & O & O & O & O & \ddots & X \\ \vdots & \vdots & \vdots & \vdots & \vdots & \vdots & & \vdots \\ O & O & O & O & O & O & \ddots & X \\ O & O & O & O & O & O & \ldots & O \\ O & O & O & O & O & O & \ldots & O \end{bmatrix};$$

the entries represented by o for a q×q matrix $\hat{N}$ are calculated and summarized as below:

$$\begin{cases} 0, & \text{if } q = 1, \\ 2, & \text{if } q = 2, \\ \frac{1}{2}(2q+1)(q-1) - 1, & \text{if } q \geq 3. \end{cases}$$

* * * * *